United States Patent
Takahashi et al.

(10) Patent No.: US 9,555,517 B2
(45) Date of Patent: Jan. 31, 2017

(54) FILM THICKNESS SIGNAL PROCESSING APPARATUS, POLISHING APPARATUS, FILM THICKNESS SIGNAL PROCESSING METHOD, AND POLISHING METHOD

(71) Applicant: EBARA CORPORATION, Tokyo (JP)

(72) Inventors: Taro Takahashi, Tokyo (JP); Hidetaka Nakao, Tokyo (JP); Akira Nakamura, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 14/832,618

(22) Filed: Aug. 21, 2015

(65) Prior Publication Data
US 2016/0074987 A1 Mar. 17, 2016

(30) Foreign Application Priority Data
Sep. 17, 2014 (JP) .................. 2014-189295

(51) Int. Cl.
| | | |
|---|---|---|
| *B24B 37/00* | (2012.01) | |
| *B24B 37/005* | (2012.01) | |
| *H01L 21/66* | (2006.01) | |
| *B24B 49/00* | (2012.01) | |

(52) U.S. Cl.
CPC ............. *B24B 37/005* (2013.01); *B24B 49/00* (2013.01); *H01L 22/14* (2013.01); *H01L 22/20* (2013.01)

(58) Field of Classification Search
CPC ........ B24B 37/005; B24B 49/00; H01L 22/20; H01L 22/14
USPC .................................. 451/5, 6, 41, 285–290
See application file for complete search history.

(56) References Cited

U.S. PATENT DOCUMENTS

| | | | | |
|---|---|---|---|---|
| 5,948,203 A | * | 9/1999 | Wang | B24B 37/005 156/345.13 |
| 6,949,007 B1 | * | 9/2005 | Wang | B24B 37/013 257/509 |
| 2005/0245169 A1 | * | 11/2005 | Morisawa | B24B 49/00 451/5 |
| 2007/0042675 A1 | * | 2/2007 | Benvegnu | B24B 37/013 451/5 |
| 2007/0103150 A1 | | 5/2007 | Tada et al. | |
| 2007/0239309 A1 | * | 10/2007 | Tada | B24B 37/005 700/121 |
| 2007/0243795 A1 | * | 10/2007 | Kobayashi | B24B 37/005 451/5 |
| 2008/0069452 A1 | * | 3/2008 | Matsumoto | G06K 9/00 382/207 |

(Continued)

FOREIGN PATENT DOCUMENTS

| | | |
|---|---|---|
| JP | 2005-011977 A | 1/2005 |
| JP | 2005-121616 A | 5/2005 |

*Primary Examiner* — George Nguyen
(74) *Attorney, Agent, or Firm* — Baker & Hostetler LLP

(57) ABSTRACT

The present invention improves the accuracy of film thickness detection. A film thickness signal processing apparatus 230 is provided with a receiving unit 232 for receiving film thickness data output from an eddy-current sensor 210 for detecting the film thickness of a polishing object 102 along a surface to be polished thereof; an identifying unit 236 for identifying the effective range of the film thickness data on the basis of the film thickness data received by the receiving unit 232; and a correcting unit 238 for correcting the film thickness data within the effective range identified by the identifying unit 236.

24 Claims, 11 Drawing Sheets

(56) References Cited

U.S. PATENT DOCUMENTS

| | | | |
|---|---|---|---|
| 2008/0146119 A1* | 6/2008 | Sasaki | B24B 49/16 451/5 |
| 2008/0268751 A1* | 10/2008 | Yokoyama | B24B 37/005 451/5 |
| 2009/0247050 A1* | 10/2009 | Arisa | B24B 49/00 451/5 |
| 2009/0275265 A1* | 11/2009 | Qian | B24B 37/013 451/5 |
| 2010/0112901 A1* | 5/2010 | Togawa | B24B 37/013 451/5 |
| 2010/0130100 A1* | 5/2010 | David | B24B 37/013 451/5 |
| 2010/0151770 A1* | 6/2010 | Nakao | B24B 37/013 451/5 |
| 2010/0297917 A1* | 11/2010 | Birang | B24B 37/013 451/5 |
| 2012/0164917 A1* | 6/2012 | Kobata | B24B 37/005 451/6 |
| 2015/0087205 A1* | 3/2015 | Zhang | B24B 37/005 451/5 |

\* cited by examiner

FILM THICKNESS SIGNAL PROCESSING APPARATUS, POLISHING APPARATUS, FILM THICKNESS SIGNAL PROCESSING METHOD, AND POLISHING METHOD

CROSS REFERENCE TO RELATED APPLICATION

This application claims priority to Japanese Patent Application No. 2014-189295 filed Sep. 17, 2014, the entire contents of which are hereby incorporated by reference.

TECHNICAL FIELD

The present invention relates to a film thickness signal processing apparatus, a polishing apparatus, a film thickness signal processing method, and a polishing method.

BACKGROUND ART

In recent years, the wiring lines of circuits have become increasingly fine and the number of layers of multilayer interconnection has increased due to the high integration and densification of semiconductor devices. In order to realize multilayer interconnection while attempting to miniaturize circuits, surfaces of semiconductor devices have to be planarization-processed with high accuracy.

Chemical-mechanical polishing (CMP) is known as a technique to planarize a surface of a semiconductor device. A polishing apparatus used to perform CMP is provided with a polishing table to which a polishing pad is attached, and a top ring for holding a polishing object (for example, a substrate, such as a semiconductor wafer, or various films formed on a surface of the substrate). The polishing apparatus polishes the polishing object by pressing the polishing object held on the top ring against the polishing pad while rotating the polishing table.

The polishing apparatus is provided with a film thickness measuring apparatus to detect the endpoint of a polishing process on the basis of the film thickness of the polishing object. The film thickness measuring apparatus is provided with a film thickness sensor for detecting the film thickness of the polishing object. Examples of the film thickness sensor typically include an eddy-current sensor and an optical sensor.

The eddy-current sensor or the optical sensor is disposed in a hole formed in the polishing table and detects a film thickness at the time phase of facing the polishing object, while revolving along with the rotation of the polishing table. The eddy-current sensor induces an eddy current in the polishing object, such as a conductive film, and detects the thickness of the polishing object from a change in a magnetic field caused by the eddy current induced in the polishing object. On the other hand, the optical sensor radiates light to the polishing object and measures an interference wave reflected from the polishing object, thereby detecting the thickness of the polishing object.

Incidentally, the film thickness sensor detects a film thickness while relatively moving along a surface to be polished of the polishing object along with the rotation of the polishing table. On the other hand, a magnetic field or light that the film thickness sensor uses to detect a film thickness has a spot diameter. Accordingly, in order for the output of the film thickness sensor to reach approximately 100%, the entire range of the spot diameter has to face the polishing object. That is, the entire range of the spot diameter of the film thickness sensor faces the polishing object under the condition of the film thickness sensor facing the central part of the surface to be polished of the polishing object, and therefore, the output of the film thickness sensor is approximately 100%. On the other hand, only part of the spot diameter of the film thickness sensor faces the polishing object under the condition of the film thickness sensor facing an edge part of the polishing object, and therefore, the output of the film thickness sensor does not reach 100%.

The related art is known to perform so-called edge cut processing in which processing is performed by discarding the output of the film thickness sensor in locations where the output of the film thickness sensor does not reach approximately 100% (Japanese Patent Laid-Open Nos. 2005-11977 and 2005-121616).

In the related art, however, no consideration is given to the improvement of the accuracy of detecting a film thickness.

That is, the related art performs so-called edge cut processing in which processing is performed by discarding the output of the film thickness sensor in locations where the output of the film thickness sensor does not reach approximately 100%. It is therefore difficult to detect a film thickness with high accuracy at edge parts of the polishing object.

Hence, it is an object of the present invention to improve the accuracy of detecting the film thickness of an edge part and widen the effective range of sensor output to improve the in-plane uniformity of a polishing object.

SUMMARY OF INVENTION

One embodiment of a film thickness signal processing apparatus of the present invention has been accomplished in view of the above-described object and is provided with a receiving unit for receiving film thickness data output from a film thickness sensor for detecting the film thickness of a polishing object along a surface to be polished thereof; an identifying unit for identifying an effective range of the film thickness data on the basis of the film thickness data received by the receiving unit; and a correcting unit for correcting the film thickness data within the effective range identified by the identifying unit.

Another embodiment of a film thickness signal processing apparatus of the present invention has been accomplished in view of the above-described object and is provided with a receiving unit for receiving film thickness data output from a film thickness sensor for detecting the film thickness of a polishing object along a surface to be polished thereof; a computing unit for determining edge parts of the effective range of the film thickness data on the basis of film thickness differences among a plurality of adjacent points of the film thickness data received by the receiving unit; and an identifying unit for identifying the effective range of the film thickness data on the basis of the edge parts determined by the computing unit.

In yet another embodiment of the film thickness signal processing apparatus, the apparatus is further provided with a computing unit for determining edge parts of the effective range of the film thickness data on the basis of film thickness differences among the plurality of adjacent points of the film thickness data received by the receiving unit, wherein the identifying unit can identify the effective range of the film thickness data on the basis of the edge parts determined by the computing unit.

In still another embodiment of the film thickness signal processing apparatus, the apparatus can be further provided with a correcting unit for correcting the film thickness data within the effective range identified by the identifying unit.

In still another embodiment of the film thickness signal processing apparatus, the computing unit can generate edge-detecting waveforms by multiplying thickness differences among a plurality of adjacent points of the film thickness data received by the receiving unit, and the identifying unit can identify a range between two peaks appearing in the edge-detecting waveforms generated by the computing unit, as the effective range.

In still another embodiment of the film thickness signal processing apparatus, the identifying unit can identify the range of a predetermined distance covered in a direction of approach toward each other with the two peaks appearing in the edge-detecting waveforms generated by the computing unit as points of origin, as a region for predetermined processing.

In still another embodiment of the film thickness signal processing apparatus, the identifying unit can identify the range of a predetermined distance covered in a direction of approach toward each other with the two peaks appearing in the edge-detecting waveforms generated by the computing unit as points of origin, as a correction region for the film thickness data to be corrected.

In still another embodiment of the film thickness signal processing apparatus, the correcting unit can correct the strength values of the film thickness data, so as to correspond to reference strength, for points of the film thickness data where strength values correlated with film thicknesses fall short of the reference strength, among the points of the film thickness data within the effective range, or can correct the strength values of the film thickness data by multiplying the strength values by a predetermined magnification greater than 1.

In still another embodiment of the film thickness signal processing apparatus, the film thickness sensor detects the film thickness of the polishing object a plurality of times along a surface to be polished thereof, and the identifying unit can identify an effective range of the film thickness data, each time the film thickness data is received by the receiving unit, on the basis of the received film thickness data.

In still another embodiment of the film thickness signal processing apparatus, the film thickness sensor detects the film thickness of the polishing object a plurality of times along a surface to be polished thereof, and the identifying unit can identify a normative effective range of the film thickness data on the basis of reference film thickness data received by the receiving unit to specify the identified normative effective range as an effective range for the plurality of film thickness data.

One embodiment of a polishing apparatus of the present invention is provided with a polishing table to which a polishing pad for polishing a polishing object is attached; a driving unit for rotary-driving the polishing table; a holding unit for holding and pressing the polishing object against the polishing pad; a film thickness sensor disposed in a hole formed in the polishing table to detect the film thickness of the polishing object along a surface to be polished thereof along with the rotation of the polishing table; and one of the above-described film thickness signal processing apparatuses.

In another embodiment of the polishing apparatus, the apparatus can be provided with a polishing apparatus control unit for controlling the pressing force of the polishing object on the basis of the film thickness data corrected by the correcting unit of the film thickness signal processing apparatus.

In yet another embodiment of the polishing apparatus, the polishing apparatus control unit can control the pressing forces of a plurality of regions of the polishing object independently, on the basis of the film thickness data corrected by the correcting unit of the film thickness signal processing apparatus.

One embodiment of a film thickness signal processing method of the present invention includes receiving film thickness data output from a film thickness sensor for detecting the film thickness of a polishing object along a surface to be polished thereof; identifying an effective range of the film thickness data on the basis of the received film thickness data; and correcting the strength values of the film thickness data so as to adjust the strength values to reference strength for the film thickness data where strength values correlated with film thicknesses fall short of the reference strength, among the film thickness data within the identified effective range, or correcting the strength values of the film thickness data by multiplying the strength values by a predetermined magnification greater than 1.

One embodiment of a polishing method of the present invention includes receiving film thickness data output from a film thickness sensor for detecting the film thickness of a polishing object along a surface to be polished thereof; identifying an effective range of the film thickness data on the basis of the received film thickness data; correcting the film thickness data within the identified effective range; and controlling the pressing force of the polishing object on the basis of the corrected film thickness data.

According to the above-described present invention, it is possible to improve the accuracy of film thickness detection.

DESCRIPTION OF EMBODIMENTS

Hereinafter, a film thickness signal processing apparatus, a polishing apparatus, a film thickness signal processing method, and a polishing method according to one embodiment of the present invention will be described with reference to the accompanying drawings.

<Polishing Apparatus>

Figure 1:
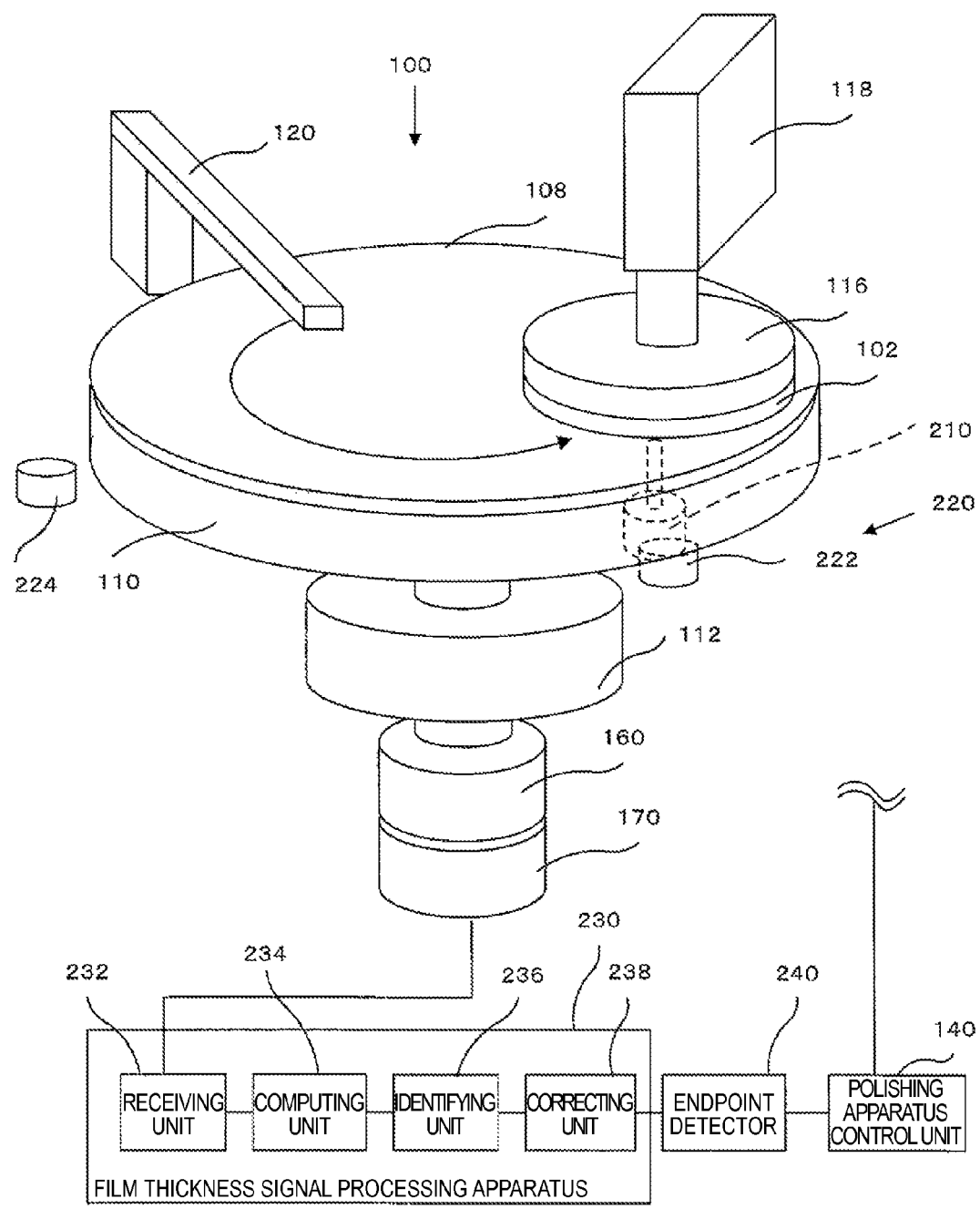
FIG. 1 is a drawing schematically illustrating the overall configuration of a polishing apparatus of a first embodiment.

FIG. 1 is a drawing schematically illustrating the overall configuration of a polishing apparatus of a first embodiment. As illustrated in FIG. 1, a polishing apparatus 100 is provided with a polishing table 110 to an upper surface of which a polishing pad 108 used to polish a polishing object (for example, a substrate, such as a semiconductor wafer, or various films formed on a surface of the substrate) 102 is attachable; a first electromotive motor (driving unit) 112 for rotary-driving the polishing table 110; a top ring (holding unit) 116 capable of holding the polishing object 102; and a second electromotive motor (driving unit) 118 for rotary-driving the top ring 116.

The polishing apparatus 100 is provided with a slurry line 120 for supplying an abrasive liquid containing a polishing agent to the upper surface of the polishing pad 108. The polishing apparatus 100 is provided with a polishing apparatus control unit 140 for outputting various control signals related to the polishing apparatus 100.

The polishing apparatus 100 is provided with an eddy-current sensor 210 disposed in a hole formed in the polishing table 110 to detect the film thickness of the polishing object 102 along a surface to be polished thereof along with the rotation of the polishing table 110. The polishing apparatus 100 is also provided with a trigger sensor 220 including a proximity sensor 222 (first member) disposed on the polishing table 110 and a dog 224 (second member) disposed outside the polishing table 110.

The eddy-current sensor 210 is provided with an exciting coil, a detection coil and a balance coil. The exciting coil is excited by an AC current supplied from an AC power line to form an eddy current in the polishing object 102 located in the vicinity of the exciting coil. A magnetic flux generated by the eddy current formed in the polishing object 102 interlinks with the detection coil and the balance coil. Since the detection coil is located in a position closer to a conductive film than the position of the balance coil, the balance between inductive voltages arising in the two coils becomes disrupted. Consequently, the eddy-current sensor 210 detects an interlinkage magnetic flux formed by the eddy current of the polishing object, thereby detecting the thickness of the polishing object on the basis of the detected interlinkage magnetic flux. Note that although an example is shown here in which the eddy-current sensor 210 is arranged, the first embodiment is not limited to this example. Alternatively, there may be arranged an optical sensor for radiating light to the polishing object to measure an interference wave reflected from the polishing object, thereby detecting the thickness of the polishing object.

The proximity sensor 222 is attached to the lower surface (a surface to which the polishing pad 108 is not attached) of the polishing table 110. The dog 224 is disposed outside the polishing table 110, so as to be detected by the proximity sensor 222. The trigger sensor 220 outputs a trigger signal indicating that the polishing table 110 has rotated one revolution, on the basis of the positional relationship between the proximity sensor 222 and the dog 224. Specifically, the trigger sensor 220 outputs the trigger signal under the condition that the proximity sensor 222 and the dog 224 are closest to each other.

The eddy-current sensor 210 is controlled, in terms of the time to start measurement and the time to end measurement, on the basis of the trigger signal output from the trigger sensor 220. For example, a time point after a lapse of a predetermined period of time from when a trigger signal is output from the trigger sensor 220 is defined as the time for the eddy-current sensor 210 to start measurement. Likewise, a time point after a lapse of a predetermined period of time from when a trigger signal is output from the trigger sensor 220 is defined as the time for the eddy-current sensor 210 to end measurement. Assume here that the predetermined periods of time are previously set as parameters.

When polishing the polishing object 102, the polishing apparatus 100 supplies polishing slurry containing polishing abrasive grains from the slurry line 120 to the upper surface of the polishing pad 108 and rotary-drives the polishing table 110 using the first electromotive motor 112. Then, the polishing apparatus 100 presses the polishing object 102 held on the top ring 116 against the polishing pad 108, while rotating the top ring 116 around a rotational axis decentered from the rotational axis of the polishing table 110. Consequently, the polishing object 102 is polished and planarized by the polishing pad 108 retaining the polishing slurry.

<Film Thickness Signal Processing Apparatus>

Next, a film thickness signal processing apparatus 230 will be described. As illustrated in FIG. 1, the film thickness signal processing apparatus 230 is connected to the eddy-current sensor 210 through rotary joint connectors 160 and 170. The film thickness signal processing apparatus 230 performs predetermined signal processing on film thickness data output from the eddy-current sensor 210, and then outputs the film thickness data to an endpoint detector 240.

The endpoint detector 240 monitors a change in the film thickness of the polishing object 102 on the basis of a signal output from the film thickness signal processing apparatus 230. The endpoint detector 240 is connected to a polishing apparatus control unit 140 for performing various types of control related to the polishing apparatus 100. Upon detection of the polishing endpoint of the polishing object 102, the endpoint detector 240 outputs a signal to that effect to the polishing apparatus control unit 140. Upon receipt of the signal indicating a polishing endpoint from the endpoint detector 240, the polishing apparatus control unit 140 finishes polishing by the polishing apparatus 100.

The film thickness signal processing apparatus 230 is provided with a receiving unit 232, a computing unit 234, an identifying unit 236, and a correcting unit 238.

The receiving unit 232 receives film thickness data output from the eddy-current sensor 210.

The computing unit 234 determines the edge parts of an effective range of the film thickness data on the basis of film thickness differences among a plurality of adjacent points of the film thickness data received by the receiving unit 232. For example, the computing unit 234 can generate edge-detecting waveforms by calculating the film thickness differences among the plurality of adjacent points of the film thickness data received by the receiving unit 232 by means of convolutional computation.

That is, assume that the film thickness data values of the plurality of adjacent points (three points) are f(i−1), f(i), and f(i+1). Then, a calculation based on a Laplacian filter F(i) is represented as F(i)={(f(i−1)−f(i))}−{(f(i)−f(i+1))}=f(i−1)−2f(i)+f(i+1). Further performing a subtraction results in F'(i)=f(i)−F(i)=−f(i−1)+3f(i)−f(i+1), thus further enhancing the edges. The two peaks appearing in the edge-detecting waveforms are defined as the edge parts of the effective range of the film thickness data. Since edges are treated as the outline of an original waveform, the edges can be used as the effective range. Note that in the present embodiment, an example is shown in which the edge-detecting waveforms are generated by multiplying film thickness differences among a plurality of adjacent points. The present embodiment is not limited to this example, however. It is possible to perform other computations, such as a computation using a Sobel filter.

The identifying unit 236 identifies an effective range of film thickness data on the basis of the film thickness data received by the receiving unit 232. Specifically, the identifying unit 236 identifies the effective range of the film thickness data on the basis of edge parts determined by the computing unit 234. More specifically, the identifying unit 236 identifies the range between two peaks appearing in the edge-detecting waveforms generated by the computing unit 234, as the effective range.

Figure 2:
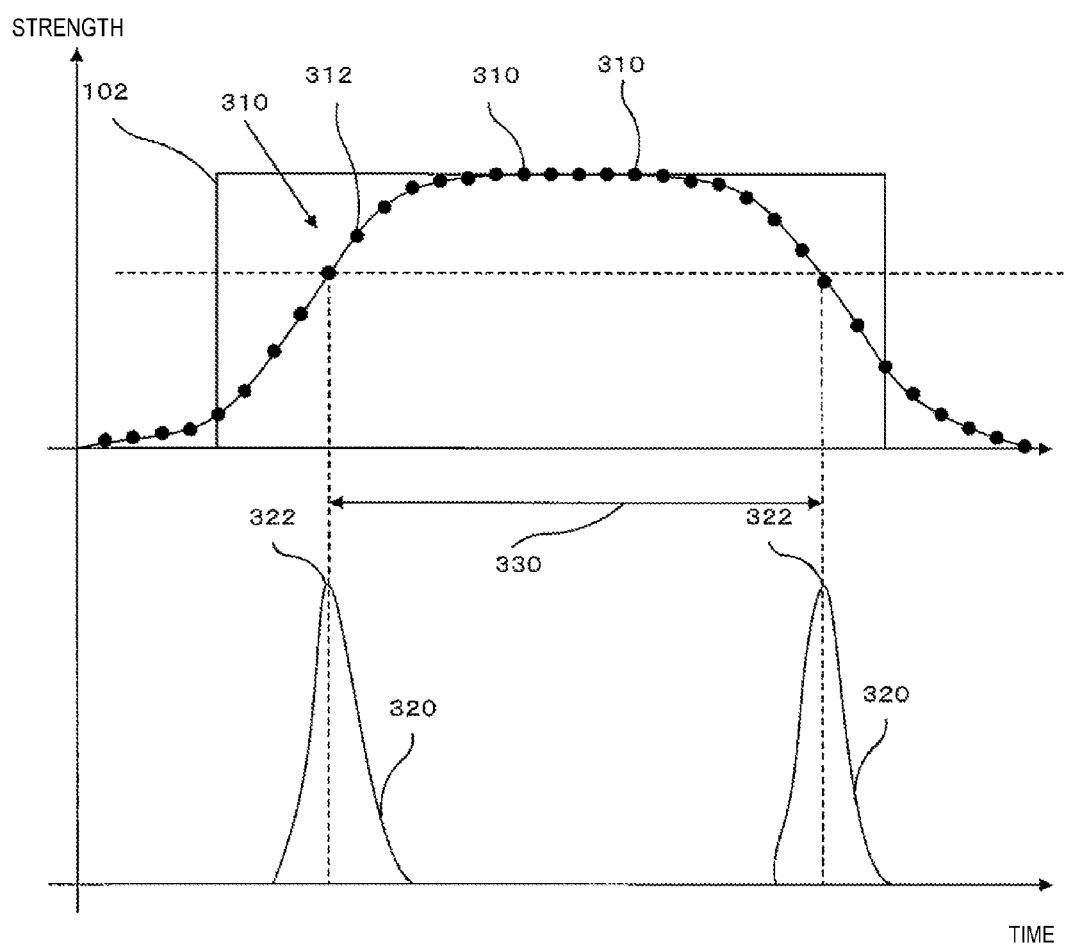
FIG. 2 is a graphical view illustrating an overview of processing by a computing unit 234 and an identifying unit 236.

The computing unit 234 and the identifying unit 236 will be described using drawings. FIG. 2 is a graphical view illustrating an overview of processing by the computing unit 234 and the identifying unit 236. In FIG. 2, the axis of abscissas represents a time course, whereas the axis of ordinates represents signal strength correlated with the film thickness of the polishing object 102.

The receiving unit 232 receives such film thickness data 310 as shown in FIG. 2 from the eddy-current sensor 210. The value of the film thickness data 310 output from the eddy-current sensor 210 becomes larger in a schematically illustrated region where the polishing object 102 is present. The film thickness data 310 is composed by plotting a plurality of time-series points 312 representing film thicknesses. As illustrated in FIG. 2, the plot of the film thickness data 310 droops at edge parts of the polishing object 102.

The computing unit 234 generates the edge-detecting waveforms 320 by multiplying differences among film thicknesses at a plurality of adjacent points 312 of the film thickness data received by the receiving unit 232. Since the edge-detecting waveforms 320 are generated by multiplying differences among film thicknesses at a plurality of adjacent points 312 of the film thickness data 310, peaks 322 appear in regions where a change in the film thickness data 310 is large, as illustrated in FIG. 2. In this example, the value of the film thickness data 310 increases in a region where the polishing object 102 and the eddy-current sensor 210 begin to face each other from the condition of not facing each other. In contrast, the value of the film thickness data 310 decreases in a region where the polishing object 102 and the eddy-current sensor 210 cease to face each other from the condition of facing each other. Consequently, two peaks 322 appear.

The identifying unit 236 identifies the range between the two peaks 322 appearing in the edge-detecting waveforms 320 generated by the computing unit 234, as an effective range 330. Note that as described above, a time point after a lapse of a predetermined period of time from when a trigger signal is output from the trigger sensor 220 is defined as the time for the eddy-current sensor 210 to start measurement. Likewise, a time point after a lapse of a predetermined period of time from when a trigger signal is output from the trigger sensor 220 is defined as the time for the eddy-current sensor 210 to end measurement. The effective range 330 of the film thickness data in the present embodiment is identified between the measurement starting time and the measurement ending time of the eddy-current sensor 210.

In addition, the identifying unit 236 can identify the range of a predetermined distance covered in a direction of approach toward each other with the two peaks 322 appearing in the edge-detecting waveforms 320 generated by the computing unit 234 as points of origin, as a correction region for the film thickness data 310 to be corrected.

Figure 3:
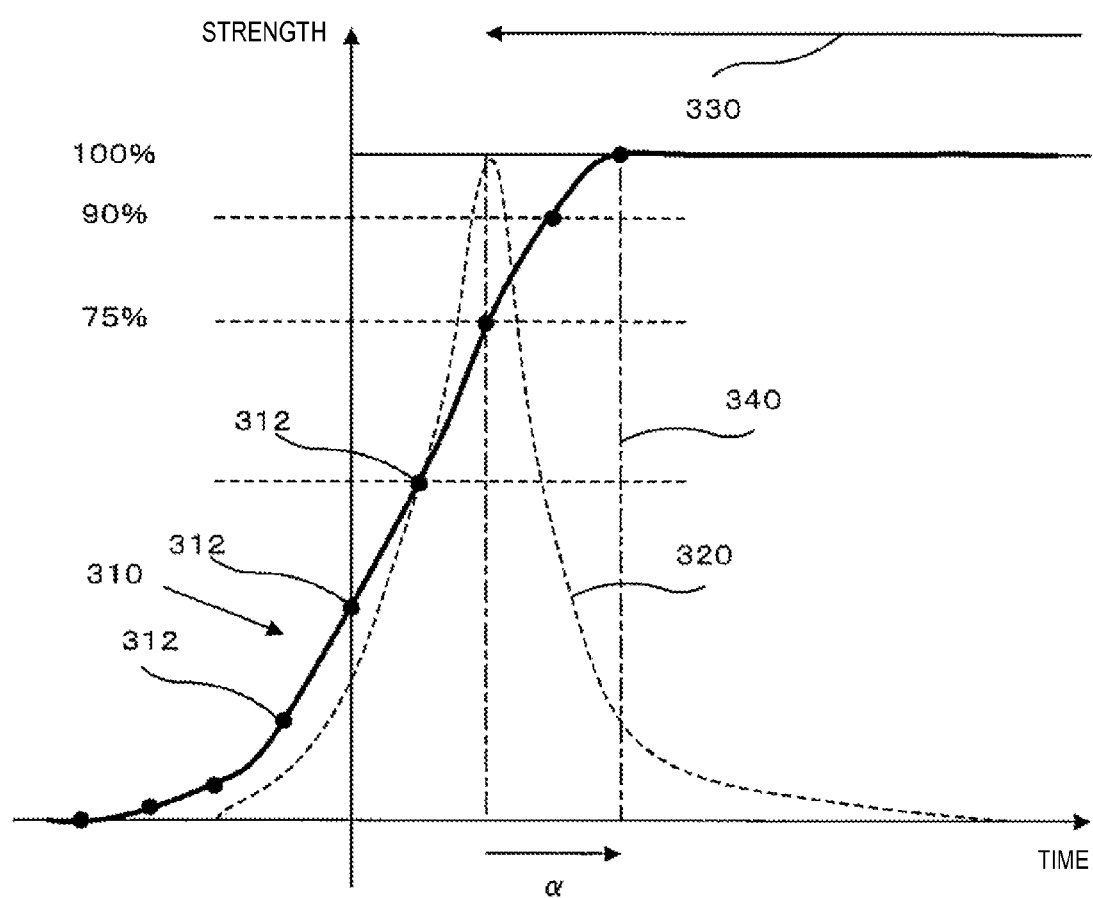
FIG. 3 is a graphical view used to describe the identification of a correction region.

A description will be made in this regard using drawings. FIG. 3 is a graphical view used to describe the identification of a correction region. In FIG. 3, the axis of abscissas represents a time course, whereas the axis of ordinates represents signal strength correlated with the film thickness of the polishing object 102. In FIG. 3, a description will be made of the identification of a correction region for one of the two peaks 322 appearing in the edge-detecting waveforms 320. The same holds true for the other peak 322, however.

As illustrated in FIG. 3, the identifying unit 236 can identify the range of a predetermined distance a covered in a direction of approach toward the other peak 322 with one of the two peaks 322 appearing in the edge-detecting waveform 320 generated by the computing unit 234 as a point of origin, as a correction region 340 for the film thickness data 310 to be corrected. The correction region 340 is identified as a partial region within the effective range 330. In the example of FIG. 3, data points, among the points of the film thickness data 310, where signal strengths are 75% and 90% are subject to correction. The predetermined distance a can be set optionally.

Note that in the present embodiment, an example is shown in which the identifying unit 236 identifies the correction region 340. The present embodiment is not limited to this example, however. The identifying unit 236 can also identify other regions for processing on the basis of the two peaks 322 appearing in the edge-detecting waveforms 320. That is, the identifying unit 236 can identify the range of a predetermined distance covered in a direction of approach toward each other with the two peaks 322 appearing in the edge-detecting waveforms 320 generated by the computing unit 234 as points of origin, as a region for predetermined processing. For example, the film thickness data of a region identified by the identifying unit 236 can be used to control the pressing force of this region when performing zone control in which a pressing force applied to the polishing pad 108 is varied for each region of the polishing object 102.

First Embodiment

Next, a first embodiment of correction will be described. The correcting unit 238 corrects the film thickness data 310 within the effective range 330 (correction region 340) identified by the identifying unit 236. Specifically, the correcting unit 238 can correct the strength values of the film thickness data, so as to correspond to reference strength, for points of the film thickness data where strength values correlated with film thicknesses fall short of the reference strength, among the points of the film thickness data within the effective range 330 (correction region 340).

Figure 4:
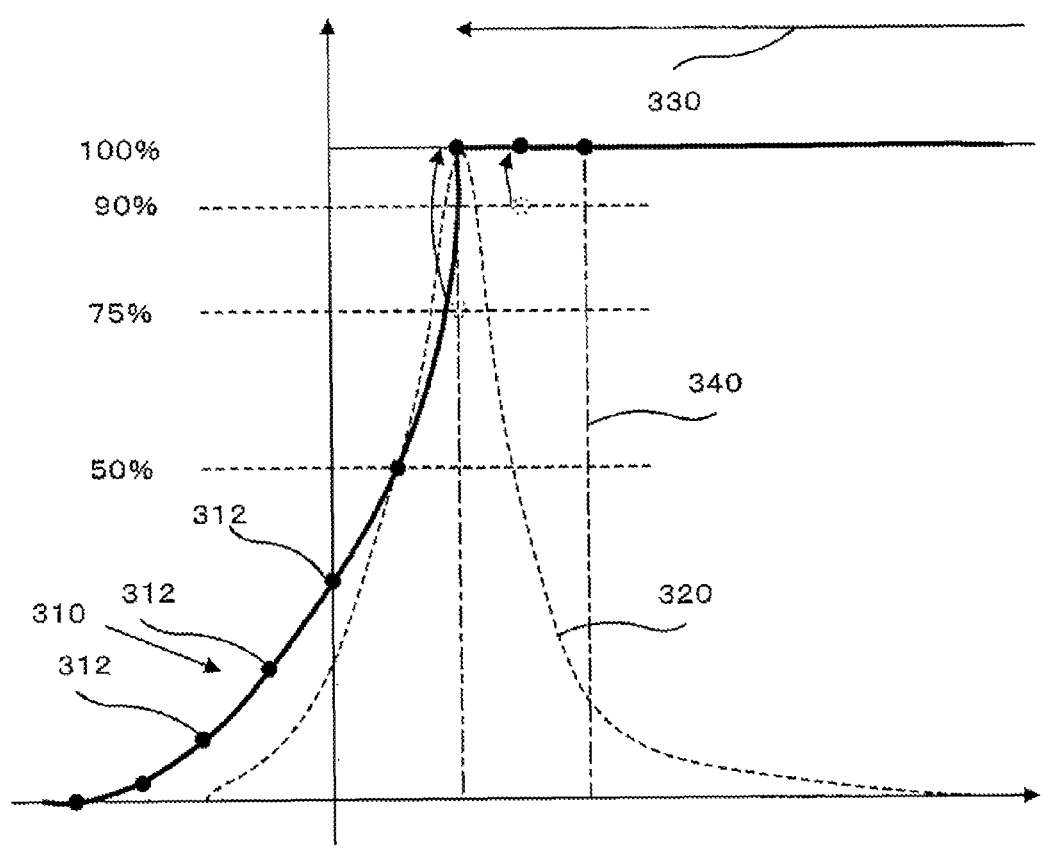
FIG. 4 is a graphical view used to describe a first embodiment of correction.

FIG. 4 is a graphical view used to describe the first embodiment of correction. Assuming that strength at which output from the eddy-current sensor 210 is 100% is reference strength, then points of film thickness data having strength values of approximately 75% and 90% within the correction region 340 are short of the reference strength, as illustrated in FIG. 4. Hence, the correcting unit 238 corrects the film thickness data having strength values of approximately 75% and 90% within the correction region 340 to a strength of 100%. Note that the correcting unit 238 does not correct the film thickness data originally having a strength value of 100% within the correction region 340.

By correcting the film thickness data in this way, it is possible to correct the drooped portion of the plot of the film thickness data 310 to film thickness data capable of being used to detect a polishing endpoint. As a result, film thicknesses can be detected with high accuracy at edge parts of a polishing object. Consequently, it is possible to widen the effective range of sensor output and improve the in-plane uniformity of the polishing object.

Second Embodiment

As described above, the eddy-current sensor 210 detects the film thickness of the polishing object 102 a plurality of times along a surface to be polished thereof, while revolving along with the rotation of the polishing table 110. In this case, the identifying unit 236 can identify an effective range 330 of film thickness data 310, each time the film thickness data 310 is received by the receiving unit 232, on the basis of the received film thickness data 310.

Figure 5:
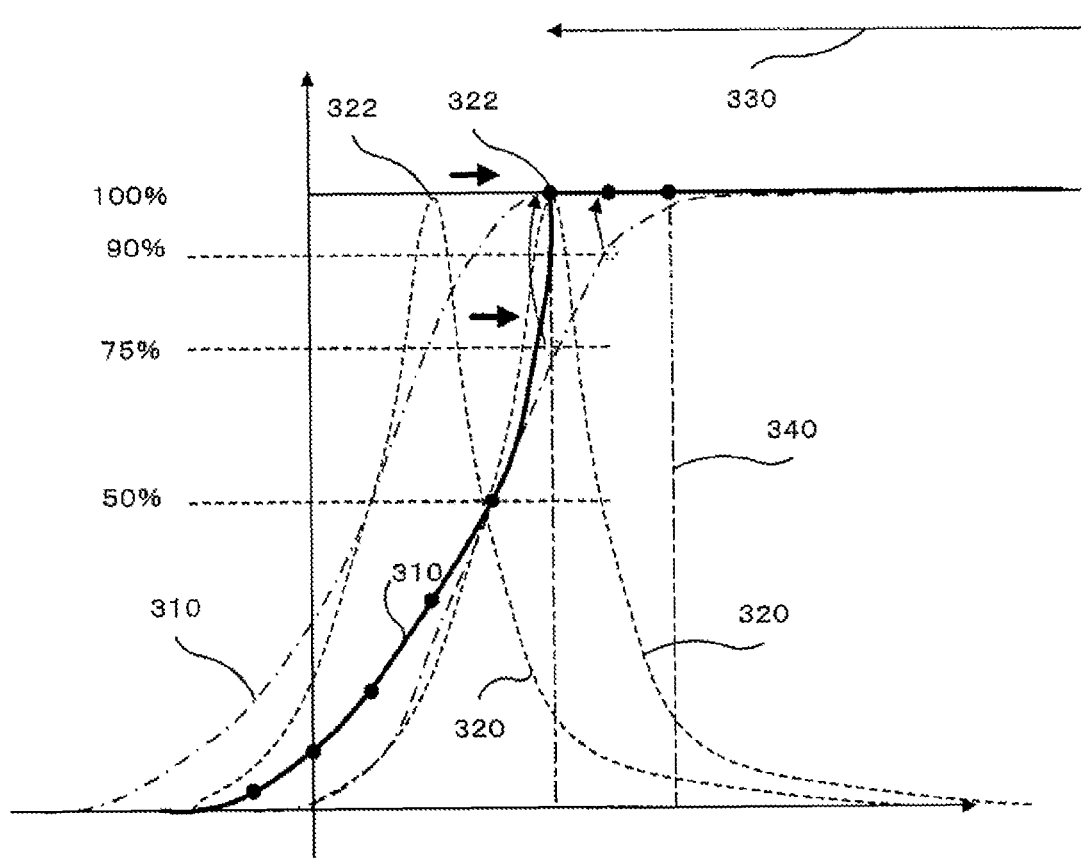
FIG. 5 is a graphical view used to describe a second embodiment of correction.

FIG. 5 is a graphical view used to describe a second embodiment of correction. As illustrated in FIG. 5, edge parts of the polishing object 102 are gradually abraded as the polishing of the polishing object 102 progresses, and therefore, the positions of the edge parts shift. Consequently, the film thickness data 310 to be received by the receiving unit 232 likewise changes. The change in the film thickness data 310 causes the positions of the two peaks 322 of the edge-detecting waveforms 320 to shift in a direction of approach toward each other. In the second embodiment, the identifying unit 236 identifies the effective range 330 and correction region 340 of the film thickness data 310 each time the positions of the two peaks 322 of the edge-detecting waveforms 320 shift.

The correcting unit 238 corrects the film thickness data 310 on the basis of the effective range 330 and the correction region 340 identified each time the film thickness data 310 is received. In the example of FIG. 5, assuming that strength at which output from the eddy-current sensor 210 is 100% is reference strength, then points of film thickness data having strength values of approximately 75% and 90% within the correction region 340 are short of the reference strength. Hence, the correcting unit 238 corrects the film thickness data having strength values of approximately 75% and 90% within the correction region 340 to a strength of 100%. Note that the correcting unit 238 does not correct the film thickness data originally having a strength value of 100% within the correction region 340.

According to the present embodiment, the effective range 330 of the film thickness data 310 is identified, each time the film thickness data 310 is received, on the basis of the received film thickness data 310. Accordingly, it is possible to identify the effective range 330 and the correction region 340 with high accuracy even if the shape of the polishing object 102 changes and the edge parts thereof shift due to polishing. As a result, film thicknesses can be detected with high accuracy at edge parts of a polishing object. Consequently, it is possible to widen the effective range of sensor output and improve the in-plane uniformity of the polishing object.

Third Embodiment

In the first and second embodiments, an example has been shown in which the correcting unit 238 corrects values of film thickness data within the correction region 340 to a strength of 100%. The present invention is not limited to these embodiments, however. That is, the correcting unit 238 can correct the strength values of the film thickness data by multiplying the strength values by a predetermined magnification greater than 1 for the film thickness data where strength values correlated with film thicknesses fall short of the reference strength, among the film thickness data within the effective range 330 (correction region 340).

Figure 6:
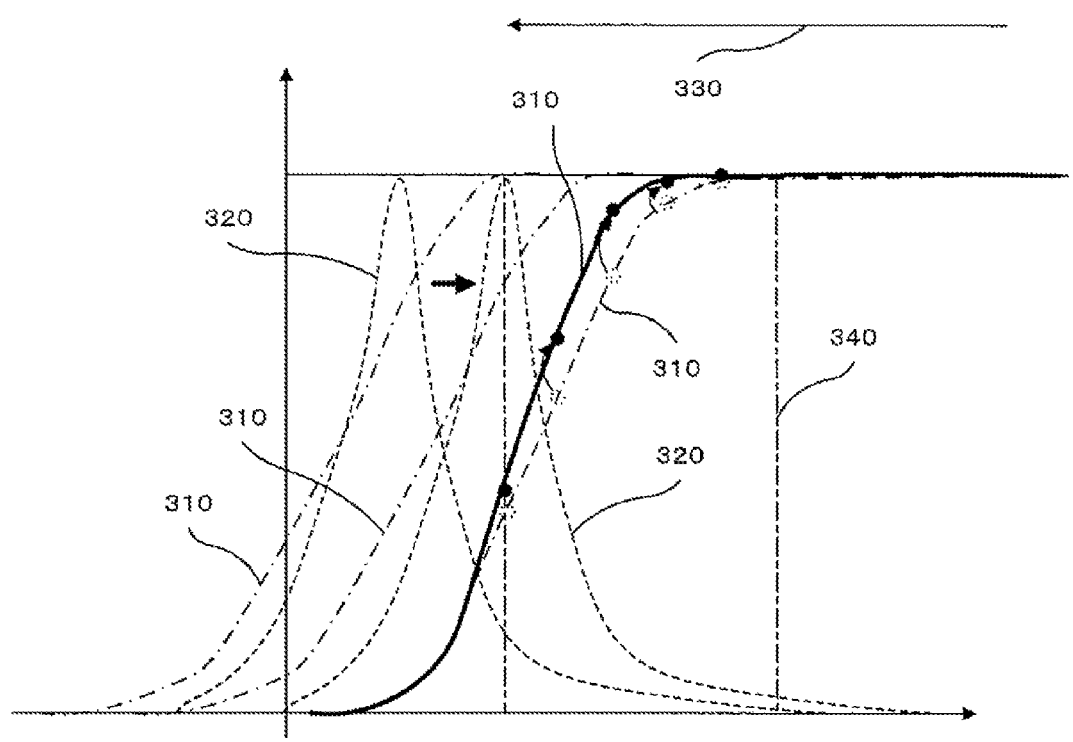
FIG. 6 is a graphical view used to describe a third embodiment of correction.

FIG. 6 is a graphical view used to describe a third embodiment of correction. As illustrated in FIG. 6, the correcting unit 238 can correct film thickness data within the correction region 340 by multiplying the data by a predetermined magnification (for example, 1.2 or 1.3 times).

According to the present embodiment, the strength values of the film thickness data are corrected by multiplying the strength values by a predetermined magnification greater than 1 for the film thickness data where the strength values fall short of the reference strength. The film thickness data can therefore be corrected smoothly. As a result, film thicknesses can be detected with high accuracy at edge parts of a polishing object. Consequently, it is possible to widen the effective range of sensor output and improve the in-plane uniformity of the polishing object.

Fourth and Fifth Embodiments

In the second and third embodiments, an example has been shown in which the effective range 330 and the correction region 340 of the film thickness data 310 are identified each time the film thickness data 310 is received. The present invention is not limited to these embodiments, however. That is, in a case where the eddy-current sensor 210 detects the film thickness of the polishing object 102 a plurality of times along a surface to be polished thereof, the identifying unit 236 can identify a normative effective range of the film thickness data on the basis of the film thickness data received by the receiving unit 232 to specify the identified normative effective range as an effective range for the plurality of film thickness data.

Figure 7:
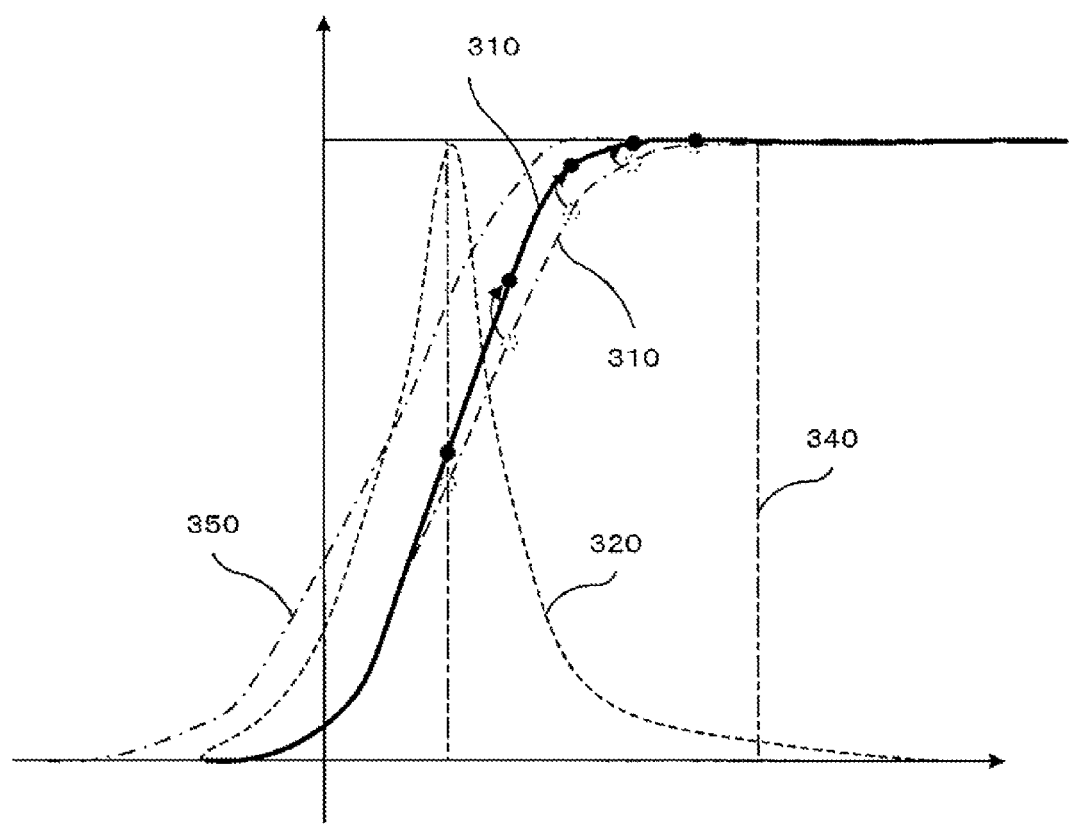
FIG. 7 is a graphical view used to describe a fourth embodiment of correction.
Figure 8:
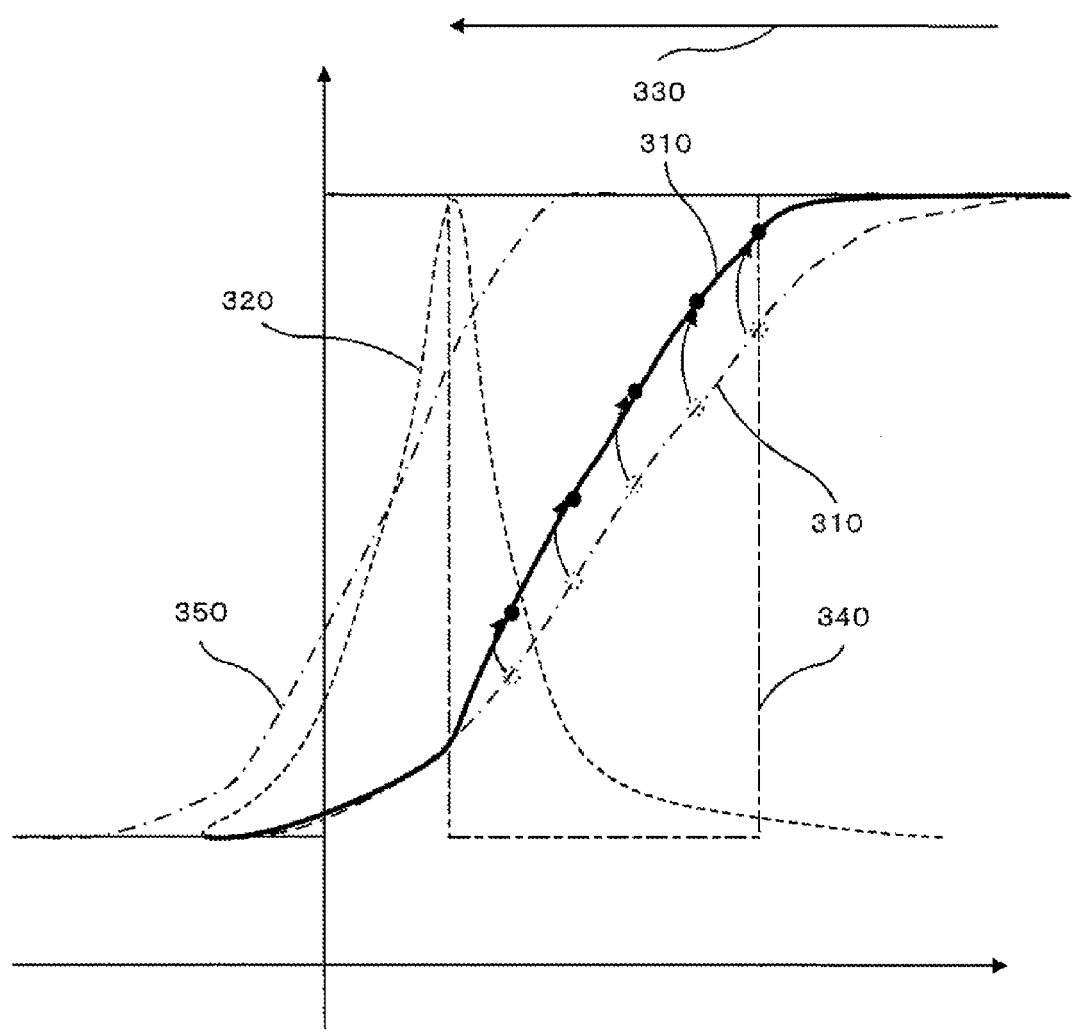
FIG. 8 is a graphical view used to describe a fifth embodiment of correction.

FIGS. 7 and 8 are graphical views used to describe fourth and fifth embodiments of correction. As illustrated in FIGS. 7 and 8, the identifying unit 236 identifies a normative effective range 330 and a correction region 340 of the film thickness data on the basis of the normative film thickness data 350 received by the receiving unit 232.

Here, the normative film thickness data 350 may be defined as film thickness data obtained when a standard polishing object prepared to acquire normative film thickness data is polished. Alternatively, the normative film thickness data 350 may be defined as film thickness data obtained when a polishing object to be actually polishing-treated is water-polished using water or the like not containing any polishing agents.

According to the present embodiment, the effective range 330 and the correction region 340 can be identified with higher accuracy since the effective range 330 and the correction region 340 are identified using the normative film thickness data 350. As a result, film thicknesses can be detected with high accuracy at edge parts of a polishing object. Consequently, it is possible to widen the effective range of sensor output and improve the in-plane uniformity of the polishing object. Note that in the fourth and fifth embodiments, an example has been shown in which the strength values of the film thickness data within the correction region 340 identified using the normative film thickness data 350 are corrected by multiplying the strength values by a predetermined magnification greater than 1. The present invention is not limited to these embodiments, however. Alternatively, it is possible to correct the strength values of the film thickness data within the correction region 340 identified using the normative film thickness data 350 to a strength of 100%.

Note that in polishing apparatuses 100 to which the above-described respective embodiments are applied, a plurality of pressure chambers may be disposed in a space inside the top ring 116 and the internal pressures of the pressure chambers may be adjusted. That is, a plurality of pressure chambers is arranged in the space formed inside the top ring 116. The plurality of pressure chambers includes a circular pressure chamber located in the middle of the space and a plurality of ring-shaped pressure chambers concentrically disposed on the outer side of this pressure chamber.

The internal pressures of the respective pressure chambers can be varied independently of one another using an unillustrated pressure-adjusting unit. Consequently, the pressing forces of the respective regions of a polishing object 102 corresponding in position to the respective pressure chambers can be adjusted almost independently of one another.

A film thickness sensor (for example, the eddy-current sensor 210) for monitoring (sensing) the state of the film of the polishing object 102 is embedded inside the polishing table 110. The eddy-current sensor 210 is connected to the film thickness signal processing apparatus 230, and the film thickness signal processing apparatus 230 is connected to the polishing apparatus control unit 140 through the endpoint detector 240. The output signal of the eddy-current sensor 210, is sent to the film thickness signal processing apparatus 230. The film thickness signal processing apparatus 230 performs required processing (arithmetic processing and correction) on the output signal of the eddy-current sensor 210, as in each of the above-described embodiments, to generate a monitoring signal (film thickness data corrected by the correcting unit 238 of the film thickness signal processing apparatus 230). The film thickness signal processing apparatus 230 manipulates the internal pressure of each pressure chamber inside the top ring 116 on the basis of the monitoring signal. That is, the film thickness signal processing apparatus 230 determines the force for the top ring 116 to press the polishing object 102, and transmits this pressing force to the polishing apparatus control unit 140. The polishing apparatus control unit 140 issues a command to an unillustrated pressure-adjusting unit, so as to change the pressing force of the top ring 116 to be applied to the polishing object 102. Note that the film thickness signal processing apparatus 230 and the polishing apparatus control unit 140 may be separate apparatuses, or may be integrated into a single control apparatus. A distribution of the film thicknesses of the polishing object 102 detected by the film thickness sensor or a distribution of signals corresponding to the film thicknesses may be transmitted to a higher-order host computer (computer connected to a plurality of semiconductor manufacturing apparatuses to manage the apparatuses) to be stored in the host computer. Then, according to the distribution of the film thicknesses of the polishing object 102 or the distribution of signals corresponding to the film thicknesses transmitted from the polishing apparatus side, the pressing conditions of the polishing object 102 for which the distribution of the film thicknesses or the distribution of signals corresponding to the film thicknesses has been detected may be determined by the host computer on the basis of the amount of polish for pressing conditions stored in a database of the host computer, and the pressing conditions may be transmitted to the control unit 104 of the polishing apparatus. Hereinafter, a description will be made of the control of the pressing force of each region of the polishing object 102.

Figure 9:
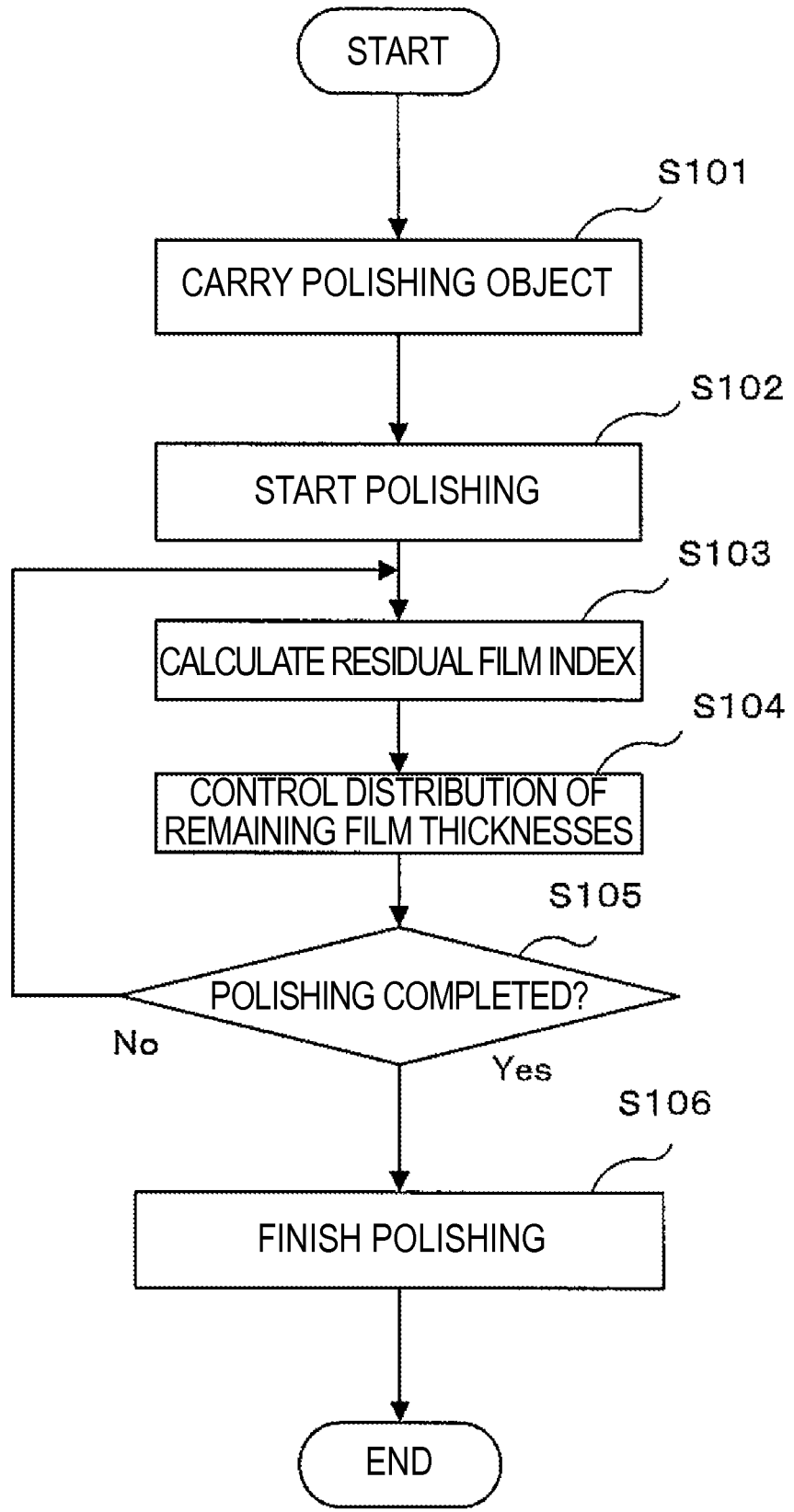
FIG. 9 is a flowchart illustrating one example of pressure control operation performed during polishing.

FIG. 9 is a flowchart illustrating one example of pressure control operation performed during polishing. First, the polishing apparatus 100 carries a polishing object 102 to a polishing position (step S101). Then, the polishing apparatus 100 begins to polish the polishing object 102 (step S102).

Next, the film thickness signal processing apparatus 230 calculates a residual film index for each region of the polishing object during the polish of the polishing object 102 (step S103). Then, the polishing apparatus control unit 140 controls a distribution of remaining film thicknesses on the basis of the residual film index (step S104).

Specifically, the polishing apparatus control unit 140 manipulates a pressure to be applied to each region of the rear surface of the polishing object 102 (i.e., the internal pressure of each pressure chamber) on the basis of the residual film index calculated for each region. Note that in the early phase of polishing, polishing characteristics (polishing rate with respect to pressure) may become unstable due to, for example, a qualitative alteration in the surface layer of the film to be polished of the polishing object 102. In that case, a predetermined waiting time may be interposed between the time a first round of control is performed and the time to start polishing.

Subsequently, the endpoint detector 240 determines, on the basis of the residual film index, whether or not the polishing of the polishing object should be finished (step S105). If the endpoint detector 240 determines that the residual film index has not yet reached a previously set target value (No in step S105), the system goes back to step S103.

On the other hand, if the endpoint detector 240 determines that the residual film index has reached the previously set target value (Yes in step S105), the polishing apparatus control unit 140 finishes polishing the polishing object (step S106). In steps S105 and 106, polishing may be finished by determining whether or not a predetermined period of time has elapsed from the start of polishing. According to the present embodiment, the effective range of sensor output is widened, and therefore, the number of measurement points for each region of the polishing object 102 increases. Consequently, it is possible to improve polishing controllability.

Figure 10:
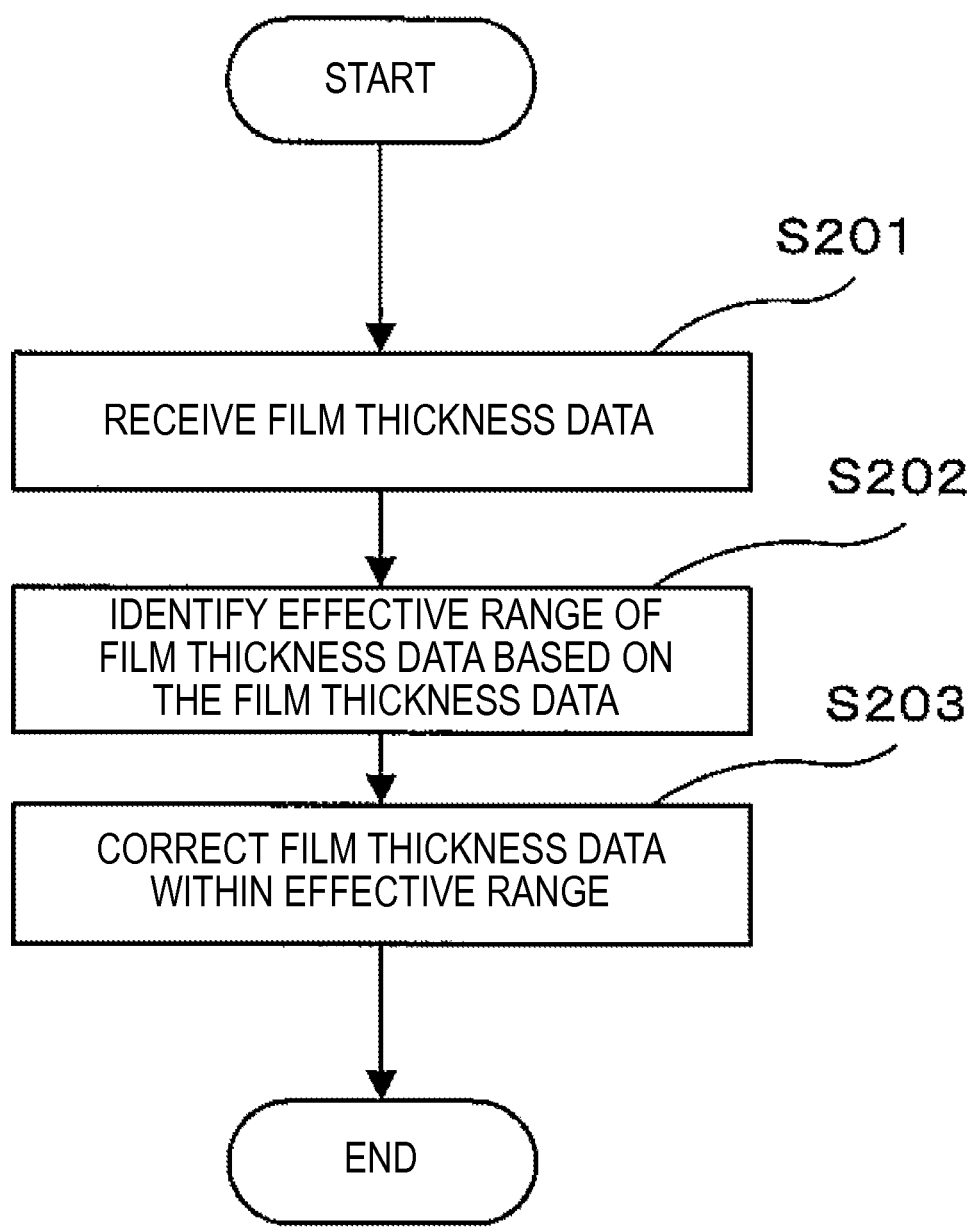
FIG. 10 is a flowchart illustrating a film thickness signal processing method of the present embodiment.

Next, a description will be made of a film thickness signal processing method of the present embodiment. FIG. 10 is a flowchart of the film thickness signal processing method of the present embodiment. First, the receiving unit 232 receives film thickness data output from the eddy-current sensor 210 for detecting the film thickness of the polishing object 102 along a surface to be polished thereof (step S201).

Then, the identifying unit 236 identifies an effective range of film thickness data on the basis of the film thickness data received by the receiving unit 232 (step S202). As described above, the identifying unit 236 can identify the effective range of the film thickness data on the basis of edge parts determined by the computing unit 234. In addition, the identifying unit 236 can identify the range between the two peaks appearing in the edge-detecting waveforms generated by the computing unit 234, as the effective range. Furthermore, the identifying unit 236 can identify the effective range of the film thickness data in the above-described various modes.

Next, the correcting unit 238 corrects the film thickness data within the effective range identified by the identifying unit 236 (step S203). The correcting unit 238 can correct the film thickness data in the above-described various modes. For example, the correcting unit 238 can correct the strength values of the film thickness data, so as to correspond to reference strength, for the film thickness data where strength values correlated with film thicknesses fall short of the reference strength, among the film thickness data within the effective range identified by the identifying unit 236, or can correct the strength values of the film thickness data by multiplying the strength values by a predetermined magnification greater than 1.

According to the film thickness signal processing method of the present embodiment, it is possible to correct the drooped portion of the plot of the film thickness data to film thickness data capable of being used to detect a polishing endpoint. As a result, according to the film thickness signal processing method of the present embodiment, film thicknesses can be detected with high accuracy at edge parts of a polishing object. Consequently, it is possible to widen the effective range of sensor output and improve the in-plane uniformity of the polishing object.

Figure 11:
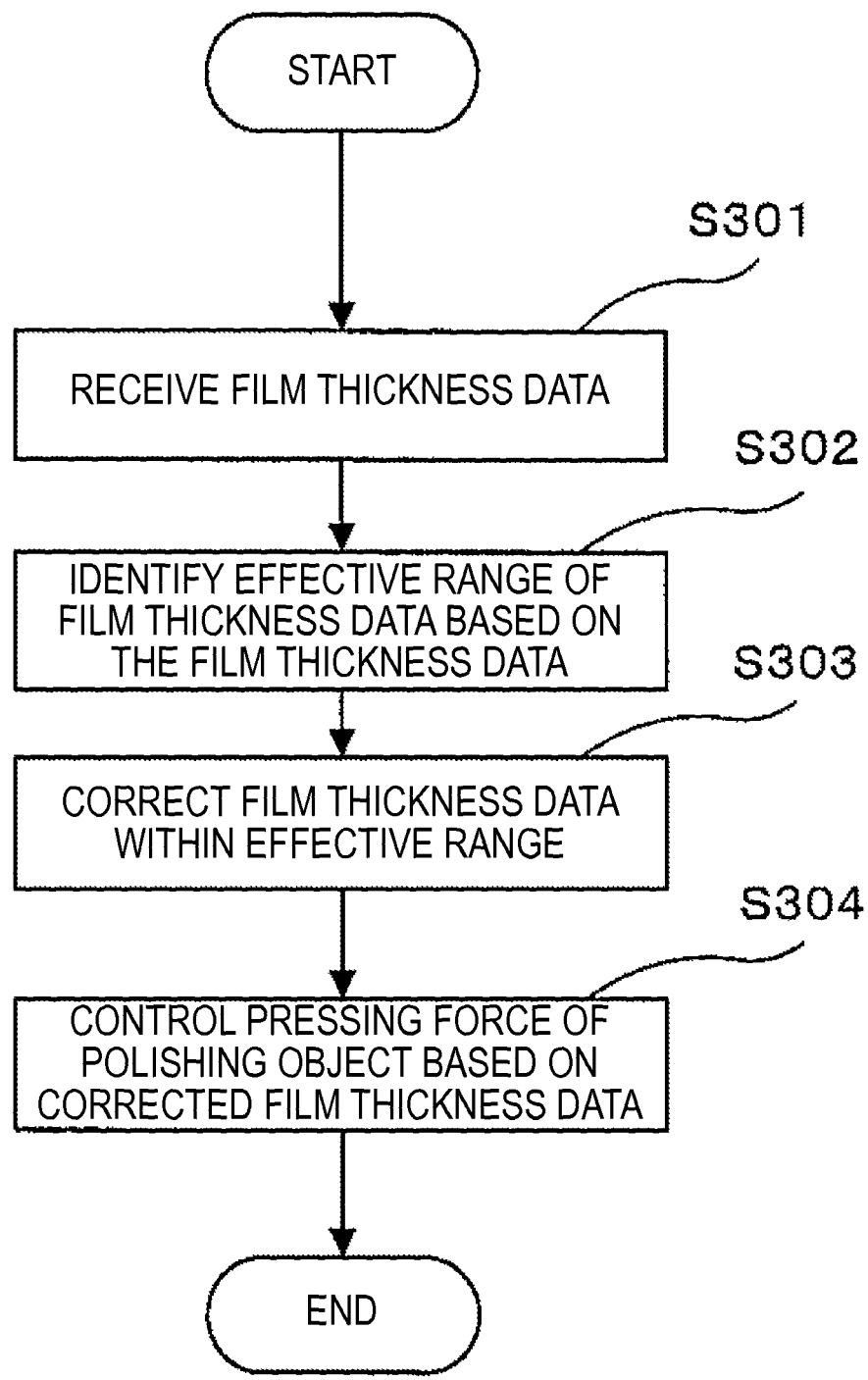
FIG. 11 is a flowchart illustrating a polishing method of the present embodiment.

Next, a description will be made of a polishing method of the present embodiment. FIG. 11 is a flowchart of the polishing method of the present embodiment.

Steps S301 to S303 in FIG. 11 are the same as steps S201 to S203 in FIG. 10, and therefore, will not be described in detail here.

After step S303, the film thickness signal processing apparatus 230 or the polishing apparatus control unit 140 controls the pressing force of the polishing object 102 on the basis of the film thickness data corrected by the correcting unit 238 (step S304). As described above, the film thickness signal processing apparatus 230 or the polishing apparatus control unit 140 determines the force for the top ring 116 to press the polishing object 102, and issues a command to an unillustrated pressure-adjusting unit, so as to change the pressing force of the top ring 116 to be applied to the polishing object 102. Details on the pressing force control of the polishing object 102 are as shown in FIG. 9.

According to the polishing method of the present embodiment, the film thickness data detected by the eddy-current sensor 210 is corrected, and therefore, the effective range of output from the eddy-current sensor 210 is widened. As a result, according to the polishing method of the present embodiment, the number of measurement points for each region of the polishing object 102 increases. Consequently, it is possible to improve polishing controllability.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

REFERENCE SIGNS LIST

100 Polishing apparatus
102 Polishing object
108 Polishing pad
110 Polishing table
112 Electromotive motor (driving unit)
116 Top ring (holding unit)
140 Polishing apparatus control unit
210 Eddy-current sensor (film thickness sensor)
220 Trigger sensor
222 Proximity sensor
224 Dog
230 Film thickness signal processing apparatus
232 Receiving unit
234 Computing unit
236 Identifying unit
238 Correcting unit
240 Endpoint detector
310 Film thickness data
320 Edge-detecting waveform
322 Peak
330 Effective range
340 Correction region
350 Normative film thickness data

What is claimed is:

1. A film thickness signal processing apparatus comprising:
a receiving unit for receiving film thickness data output from a film thickness sensor for detecting the film thickness of a polishing object along a surface to be polished thereof;
an identifying unit for identifying an effective range of the film thickness data on the basis of the film thickness data received by the receiving unit; and
a correcting unit for correcting the film thickness data within the effective range identified by the identifying unit.

2. The film thickness signal processing apparatus according to claim 1, further comprising a computing unit for determining edge parts of the effective range of the film thickness data on the basis of film thickness differences among the plurality of adjacent points of the film thickness data received by the receiving unit, wherein the identifying unit identifies the effective range of the film thickness data on the basis of the edge parts determined by the computing unit.

3. The film thickness signal processing apparatus according to claim 2, wherein the computing unit generates edge-detecting waveforms by multiplying by thickness differences among a plurality of adjacent points of the film thickness data received by the receiving unit, and the identifying unit identifies a range between two peaks appearing in the edge-detecting waveforms generated by the computing unit, as the effective range.

4. The film thickness signal processing apparatus according to claim 3, wherein the identifying unit identifies the range of a predetermined distance covered in a direction of approach toward each other with the two peaks appearing in the edge-detecting waveforms generated by the computing unit as points of origin, as a region for predetermined processing.

5. The film thickness signal processing apparatus according to claim 3, wherein the identifying unit identifies the range of a predetermined distance covered in a direction of approach toward each other with the two peaks appearing in the edge-detecting waveforms generated by the computing unit as points of origin, as a correction region for the film thickness data to be corrected.

6. The film thickness signal processing apparatus according to claim 1, wherein the correcting unit corrects the strength values of the film thickness data, so as to correspond to reference strength, for the film thickness data where strength values correlated with film thicknesses fall short of the reference strength, among the film thickness data within the effective range, or corrects the strength values of the film thickness data by multiplying the strength values by a predetermined magnification greater than 1.

7. The film thickness signal processing apparatus according to claim 1, wherein the film thickness sensor detects the film thickness of the polishing object a plurality of times along a surface to be polished thereof, and the identifying unit identifies an effective range of the film thickness data, each time the film thickness data is received by the receiving unit, on the basis of the received film thickness data.

8. The film thickness signal processing apparatus according to claim 1, wherein the film thickness sensor detects the film thickness of the polishing object a plurality of times along a surface to be polished thereof, and the identifying unit identifies a normative effective range of the film thickness data on the basis of reference film thickness data received by the receiving unit to specify the identified normative effective range as an effective range for the plurality of film thickness data.

9. A polishing apparatus comprising:
a polishing table to which a polishing pad for polishing a polishing object is attached;
a driving unit for rotary-driving the polishing table;
a holding unit for holding and pressing the polishing object against the polishing pad;
a film thickness sensor disposed in a hole formed in the polishing table to detect the film thickness of the polishing object along a surface to be polished thereof along with the rotation of the polishing table; and
a film thickness signal processing apparatus according to claim 1.

10. The polishing apparatus according to claim 9, comprising a polishing apparatus control unit for controlling the pressing force of the polishing object on the basis of the film thickness data corrected by the correcting unit of the film thickness signal processing apparatus.

11. The polishing apparatus according to claim 10, wherein the polishing apparatus control unit controls the pressing forces of a plurality of regions of the polishing object independently, on the basis of the film thickness data corrected by the correcting unit of the film thickness signal processing apparatus.

12. A film thickness signal processing apparatus comprising:
a receiving unit for receiving film thickness data output from a film thickness sensor for detecting the film thickness of a polishing object along a surface to be polished thereof;
a computing unit for determining edge parts of the effective range of the film thickness data on the basis of film thickness differences among a plurality of adjacent points of the film thickness data received by the receiving unit; and
an identifying unit for identifying the effective range of the film thickness data on the basis of the edge parts determined by the computing unit.

13. The film thickness signal processing apparatus according to claim 2, further comprising a correcting unit for correcting the film thickness data within the effective range identified by the identifying unit.

14. The film thickness signal processing apparatus according to claim 12, wherein the computing unit generates edge-detecting waveforms by multiplying by thickness differences among a plurality of adjacent points of the film thickness data received by the receiving unit, and the identifying unit identifies a range between two peaks appearing in the edge-detecting waveforms generated by the computing unit, as the effective range.

15. The film thickness signal processing apparatus according to claim 14, wherein the identifying unit identifies the range of a predetermined distance covered in a direction of approach toward each other with the two peaks appearing in the edge-detecting waveforms generated by the computing unit as points of origin, as a region for predetermined processing.

16. The film thickness signal processing apparatus according to claim 14, wherein the identifying unit identifies the range of a predetermined distance covered in a direction of approach toward each other with the two peaks appearing in the edge-detecting waveforms generated by the computing unit as points of origin, as a correction region for the film thickness data to be corrected.

17. The film thickness signal processing apparatus according to claim 13, wherein the correcting unit corrects the strength values of the film thickness data, so as to correspond to reference strength, for the film thickness data where strength values correlated with film thicknesses fall short of the reference strength, among the film thickness data within the effective range, or corrects the strength values of the film thickness data by multiplying the strength values by a predetermined magnification greater than 1.

18. The film thickness signal processing apparatus according to claim 12, wherein the film thickness sensor detects the film thickness of the polishing object a plurality of times along a surface to be polished thereof, and the identifying unit identifies an effective range of the film thickness data, each time the film thickness data is received by the receiving unit, on the basis of the received film thickness data.

19. The film thickness signal processing apparatus according to claim 12, wherein the film thickness sensor detects the film thickness of the polishing object a plurality of times along a surface to be polished thereof, and the identifying unit identifies a normative effective range of the film thickness data on the basis of reference film thickness data received by the receiving unit to specify the identified normative effective range as an effective range for the plurality of film thickness data.

20. A polishing apparatus comprising:
a polishing table to which a polishing pad for polishing a polishing object is attached;
a driving unit for rotary-driving the polishing table;
a holding unit for holding and pressing the polishing object against the polishing pad;
a film thickness sensor disposed in a hole formed in the polishing table to detect the film thickness of the polishing object along a surface to be polished thereof along with the rotation of the polishing table; and
a film thickness signal processing apparatus according to claim 12.

21. The polishing apparatus according to claim 20,
wherein the film thickness signal processing apparatus comprises a correcting unit for correcting the film thickness data within the effective range identified by the identifying unit,
and the polishing apparatus comprises a polishing apparatus control unit for controlling the pressing force of the polishing object on the basis of the film thickness data corrected by the correcting unit of the film thickness signal processing apparatus.

22. The polishing apparatus according to claim 21, wherein the polishing apparatus control unit controls the pressing forces of a plurality of regions of the polishing object independently, on the basis of the film thickness data corrected by the correcting unit of the film thickness signal processing apparatus.

23. A film thickness signal processing method comprising:
receiving film thickness data output from a film thickness sensor for detecting the film thickness of a polishing object along a surface to be polished thereof;
identifying an effective range of the film thickness data on the basis of the received film thickness data; and
correcting the strength values of the film thickness data so as to adjust the strength values to reference strength for the film thickness data where strength values correlated with film thicknesses fall short of the reference strength, among the film thickness data within the identified effective range, or correcting the strength values of the film thickness data by multiplying the strength values by a predetermined magnification greater than 1.

24. A polishing method comprising:

receiving film thickness data output from a film thickness sensor for detecting the film thickness of a polishing object along a surface to be polished thereof;

identifying an effective range of the film thickness data on the basis of the received film thickness data;

correcting the film thickness data within the identified effective range; and controlling the pressing force of the polishing object on the basis of the corrected film thickness data.

\* \* \* \* \*